United States Patent
Cheah et al.

(10) Patent No.: US 10,085,342 B2
(45) Date of Patent: Sep. 25, 2018

(54) MICROELECTRONIC DEVICE HAVING AN AIR CORE INDUCTOR

(71) Applicant: Intel Corporation, Santa Clara, CA (US)

(72) Inventors: Bok Eng Cheah, Bukit Gambir (MY); Jackson Chung Peng Kong, Tokong (MY); Khang Choong Yong, Puchong (MY); Min Suet Lim, Simpang Ampat (MY); Chin Lee Kuan, Bayan Lepas (MY); Howe Yin Loo, Sungai Petani (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/376,872

(22) Filed: Dec. 13, 2016

(65) Prior Publication Data

US 2018/0168043 A1    Jun. 14, 2018

(51) Int. Cl.

| | |
|---|---|
| H01L 21/00 | (2006.01) |
| H01L 23/48 | (2006.01) |
| H05K 1/16 | (2006.01) |
| H01F 17/02 | (2006.01) |
| H01F 17/00 | (2006.01) |
| H01F 41/04 | (2006.01) |
| H01L 23/498 | (2006.01) |

(Continued)

(52) U.S. Cl.
CPC ......... *H05K 1/165* (2013.01); *H01F 17/0006* (2013.01); *H01F 17/02* (2013.01); *H01F 41/046* (2013.01); *H01L 21/4846* (2013.01); *H01L 23/49822* (2013.01); *H01L 23/49827* (2013.01); *H01L 23/49838* (2013.01); *H01L 24/17* (2013.01); *H01L 2224/16227* (2013.01); *H01L 2924/15311* (2013.01); *H01L 2924/19042* (2013.01)

(58) Field of Classification Search
CPC ..... H05K 1/165; H01F 17/0006; H01F 17/02; H01F 41/046; H01L 21/4846; H01L 23/49822; H01L 23/49827; H01L 23/49838; H01L 24/17
See application file for complete search history.

(56) References Cited

U.S. PATENT DOCUMENTS

| | | | |
|---|---|---|---|
| 7,646,108 B2 * | 1/2010 | Paillet | H02M 3/158 307/11 |
| 8,710,948 B2 | 4/2014 | Singh et al. | |

(Continued)

OTHER PUBLICATIONS

"International Application Seriai No. PCT/US2017/061128, International Search Report dated Feb. 27, 2018", 3 pgs.

(Continued)

*Primary Examiner* — Nicholas Tobergte
(74) *Attorney, Agent, or Firm* — Schwegman Lundberg & Woessner, P.A.

(57) ABSTRACT

A microelectronic device incorporating an air core inductor having one or more inserts to provide efficiency of the inductor are described. One or more inserts having a selected permeability may be placed within regions defined by coils of the air core inductor. The inserts can be formed of a solid material of the selected permeability or such a material can be applied to other structures, such as circuit components. Other embodiments may be described and/or claimed.

23 Claims, 10 Drawing Sheets

(51) Int. Cl.
*H01L 21/48* (2006.01)
*H01L 23/00* (2006.01)

(56) References Cited

U.S. PATENT DOCUMENTS

| | | | | |
|---|---|---|---|---|
| 8,803,283 | B2* | 8/2014 | Jezewski | H01L 23/5227 |
| | | | | 257/531 |
| 8,907,756 | B2* | 12/2014 | Sainz | H01F 17/0006 |
| | | | | 336/200 |
| 9,198,293 | B2* | 11/2015 | Chase | H05K 1/0222 |
| 9,515,003 | B1* | 12/2016 | Fitzgerald | H01L 23/5227 |
| 9,526,175 | B2* | 12/2016 | Manusharow | H01L 23/13 |
| 2004/0263310 | A1* | 12/2004 | Ding | H01F 17/0006 |
| | | | | 336/223 |
| 2009/0278246 | A1 | 11/2009 | Hoshino et al. | |
| 2014/0002223 | A1 | 1/2014 | Sainz | |
| 2014/0104288 | A1* | 4/2014 | Shenoy | G09G 5/00 |
| | | | | 345/531 |
| 2014/0159850 | A1 | 6/2014 | Roy et al. | |
| 2014/0203399 | A1 | 7/2014 | Hofmann et al. | |
| 2014/0217547 | A1 | 8/2014 | Elsherbini et al. | |
| 2015/0054612 | A1 | 2/2015 | Sainz | |
| 2016/0133373 | A1* | 5/2016 | Orr | H01L 23/645 |
| | | | | 336/170 |
| 2017/0178786 | A1* | 6/2017 | Lambert | H01F 27/2804 |

OTHER PUBLICATIONS

"International Application Serial No. PCT/US2017/061128, Written Opinion dated Feb. 27, 2018", 5 pgs.

* cited by examiner

MICROELECTRONIC DEVICE HAVING AN AIR CORE INDUCTOR

TECHNICAL FIELD

Embodiments described herein relate generally to microelectronic devices having an air core inductor; and more specifically relate to microelectronic devices having an air core inductor having one or more structures to enhance magnetic flux density in the inductor.

BACKGROUND

Microelectronic devices such as IC (integrated circuit) packages can include some form of a voltage regulator for one or more semiconductor die (herein, "die"), within the package. In some configurations, such voltage regulators include one or more air core inductors (each, an "ACI"). Conventional ACIs can offer less than optimal performance, and in some cases can require the presence of additional components in the package, such as magnetic inductor arrays and/or capacitors to compensate for the performance limitations. In other cases, this less than optimal performance can require that the ACI be constructed with coils of larger dimensions and/or an increased number of turns (realized through an increased number of coil layers, in many constructions) than would otherwise be required, in order to achieve a desired quality (Q) factor of the inductor. Such additional components, or increased dimensions and/or turns of the inductor coils, can increase the required dimensions of the microelectronic device package. Such required dimensions can be increased in the lateral dimensions (in the X-Y directions, as may be defined by the major dimensions of the substrate) and/or in the vertical (Z) direction (extending generally perpendicularly to the substrate).

Additionally, in some conventional systems, in order for the device package to be used in some applications, other structures may need to be modified to accept the microelectronic device package. For example, in some conventional microelectronic device package configurations, one or more of the described additional components of the voltage regulator may be coupled to the ball grid array (BGA) side of the substrate, and may have a Z dimension greater than that of the BGA. Thus, such package configurations require a recess within a motherboard or other connecting structure. Such requirements undesirably increase the cost of manufacture of the motherboard (or other structure).

BRIEF DESCRIPTION OF THE DRAWINGS

FIGS. 1A-C are schematic representations of an example microelectronic device package in accordance with the present description, in which FIG. 1A depicts the package from a top view; FIG. 1B depicts the package from a bottom view; and FIG. 1C depicts an enlarged section of the bottom view of FIG. 1B beneath the outermost layer(s) of the substrate.

FIGS. 2A-B are schematic representations of cross-sectional views of a microelectronic device package generally in accordance with the microelectronic device of FIGS. 1A-C, in which FIG. 2A depicts a view of the entire device cross-section; while FIG. 2B depicts an enlarged view of a region of the device package including an air core inductor.

DESCRIPTION OF EMBODIMENTS

Figure 1A:
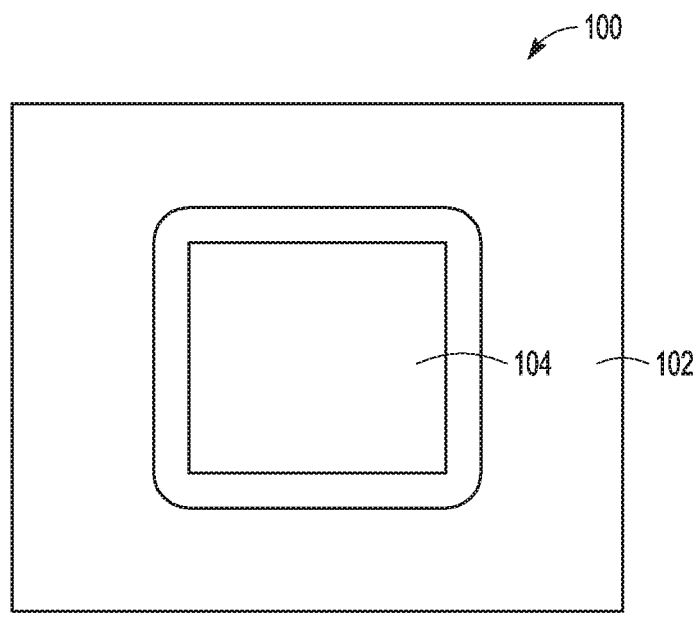

The following description and the drawings sufficiently illustrate specific example embodiments to enable those skilled in the art to practice them. The described examples are intended to be illustrative, and not limited on the scope of the present disclosure. Other embodiments may incorporate structural, logical, electrical, process, and other changes. Portions and features of some embodiments may be included in, or substituted for, those of other embodiments. Example embodiments set forth in the claims encompass all available equivalents of those claims.

The present description addresses example embodiments of a microelectronic device incorporating an ACI having one or more inserts to provide an enhanced Q-factor of the inductor relative to the same configuration of inductor without such inserts. An enhanced Q-factor provided through use of the described inserts can simplify the design of other components in the microelectronic device, for example of voltage regulators (for example, by eliminating additional components that would otherwise be required or by reducing the size of such additional components); and/or by reducing one or more dimensions of the ACI.

In the example configurations, the ACI is depicted in an example configuration which may be formed in a substrate of the microelectronic device package. In the depicted examples, an insert may be placed in a central region defined by at least one of the first and second coils of the ACI. In many examples, the insert may have a relative permeability of 2 or greater. Such relative permeability ($\mu_r$) is the ratio of the permeability ($\mu$) of a medium to the permeability of a vacuum ($\mu_0$). Air has a permeability of approximately $1.25 \times 10^{-6}$ henries per meter, and a relative permeability of approximately 1. Dielectric material as commonly used in forming a substrate typically has a very similar relative permeability of approximately 1. Thus, in many examples the insert may have a relative permeability at least twice that of air. In other examples, the inserts may have a permeability of $1.0 \times 10^{-5}$ henries per meter (resulting in a relative permeability of approximately 8 or greater).

In many examples, one or more inserts may be placed in each of central regions defined by each coil of the inductor. The described inserts can be of different configurations. For example, the inserts can be a volume of a selected material, in some examples, either a ferrite material or an iron composite material. In some examples, the selected material may be in the form of a shaped plug, inserted into an appropriately shaped trench formed in a dielectric material extending within the central region defined by the coil. In other examples, the volume of the selected material can be deposited, such as by sputtering or electroplating.

In other examples, one or more of the described inserts may be an electrical component, for example a passive component (such as a resistor or capacitor) that contains and/or is coated with a selected material such that the component has a relative permeability of 2 or greater. In other examples, the selected material may have a permeability of $1.0 \times 10^{-5}$ henries per meter or greater (i.e., a relative permeability of approximately 8 or greater). In many examples, as will be addressed in more detail below, the relative permeability may be substantially greater, for example anywhere within the range of 16-640, or greater. In some examples, the passive component can be a component of a circuit containing the ACI, for example a voltage regulator circuit.

Figure 1B:
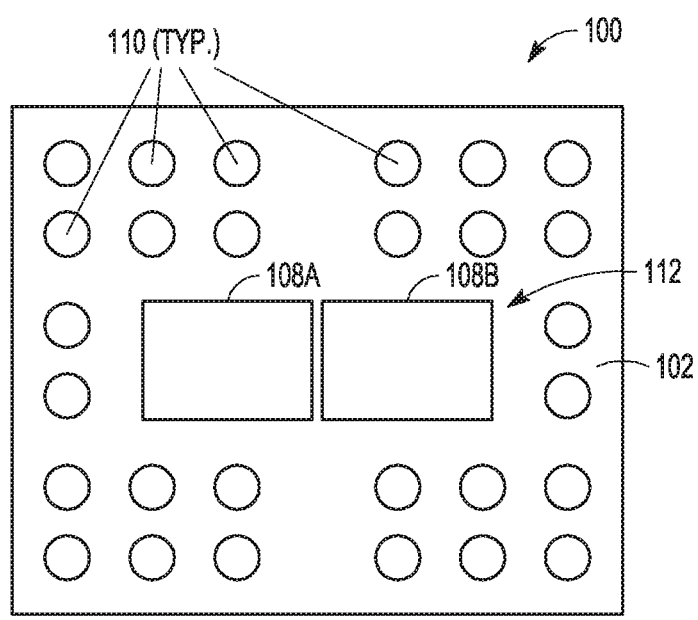
Figure 1C:
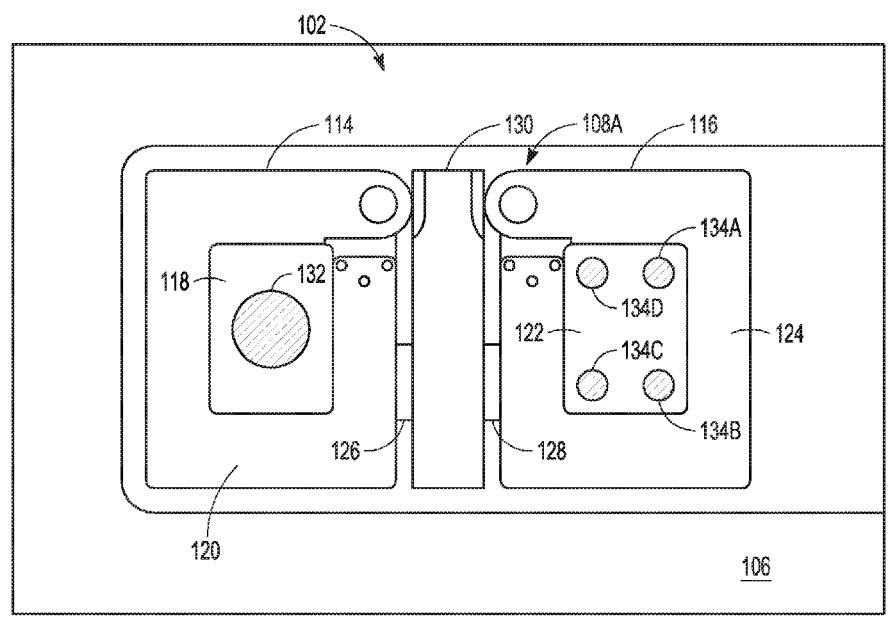

Referring now to FIGS. 1A-C, the figures schematically depict an example microelectronic device 100 incorporating the present concepts. FIGS. 1A and B depict external views of microelectronic device 100, which incorporates an example ACI array, in this example as an internal structure, as shown in FIG. 1C. As can be seen in the top view of FIG. 1A, microelectronic device 100 includes a substrate 102 having a semiconductor die 104 attached thereto. FIG. 1B depicts microelectronic device 100 from a bottom view and showing an example ACI array, indicated generally at 112. In the depicted example, ACI array 112 includes two ACIs 108A and 108B (beneath a solder resist layer in FIG. 1B, and depicted beneath the solder resist in FIG. 1C. Because the description of a single ACI is instructive as to the various possible configurations for both, the following description will address only the structure of ACI 108A. As will be apparent from the following discussion, microelectronic device may include any desired number of ACIs, and when multiple ACIs are present in a microelectronic device the ACIs may be constructed differently from one another.

In many examples, ACI 108A may be formed as an integral part of substrate 102 during the manufacture of other layers of the substrate (as will be described in more detail in relation to FIGS. 2A-B and 6A-E). In other examples, the substrate 102 may include a recess in the bottom surface 106, with the ACI 108A formed or placed therein.

Bottom surface 106 of substrate 102 includes a ball grid array (BGA) of solder balls, indicated typically at 110. In many examples, a solder resist material may extend over the upper and lower surfaces of substrate 102.

FIG. 1C provides an enlarged view of the portion of lower surface 106 supporting the ACI 108A, beneath the solder resist material. In some examples, the region of substrate 102 supporting ACI 108A may be configured such that the entire Z dimension of ACI 108A may be within the Z dimension of substrate 102.

In the illustrative example, ACI 108A includes first and second coils 114 and 116, respectively. The specific structure of each coil 114, 116 may be any of multiple constructions known to persons skilled in the art. In many examples, coils 114, 116 may be formed of a structure suitable for manufacture by conventional semiconductor processing, in particular processing as is suitable for manufacture of the substrate. For purposes of the present illustrative description, ACI coils 114, 116 are depicted and described in reference to a multilayer coil structure, which may be formed by sequential metallization layers separated by dielectric, with the metallization layers sequentially interconnected through vertical interconnects (such as microvias) to form a spiral coil. Thus, the described spiral coil structure forms a multilayer coil. Coil 114 surrounds and defines a first central region 118 extending within the lateral (X-Y) dimensions of the conductive structure 120 of the coil (the plane of FIG. 1C extends in the X-Y dimensions). Similarly, coil 116 surrounds and defines a second central region 122 extending within the lateral dimensions of the conductive structure 124 of the coil. In example ACI 108A, a respective first end of each coil 114, 116 (indicated at 126, 128, respectively), is coupled to a shorting bar 130 extending between the coils.

In many examples, the first and second central regions 118, 122 may include dielectric material placed during the process of forming coils 114 and 116. However, as will be apparent from the following description, in some examples, the presence of such dielectric material in first and second central regions 118, 122 is not required. In the present example, each of first and second central regions 118, 122 is shown as having a generally rectangular form. Such shape is not required, however, and coils 114, 116 can be formed in any desired shape, and may define central regions that are substantially circular, oval, polygonal, or other shapes other than rectangular, as depicted. As will be apparent from the discussion herein, each layer of the coil may be slightly less than a continuous rectangle, oval, etc. where one end of the coil layer will vertically connect with the coil layer above.

ACI 108A includes one or more inserts within each of first and second central regions 118 and 122. For illustrative purposes, different configurations of inserts are depicted in each of first and second central regions 118 and 122, but in some examples, the same type and distribution of insert may be used in the central region of each coil of an ACI. In a first configuration, a single insert 132 is positioned within the generally middle portion of first central region 118. An alternate configuration is also represented in which four inserts 134A-D are placed proximate the four corners of second central region 122.

In example ACI 108A, inserts (such as 132, 134A-D, or other configurations as will be discussed herein) are provided to improve the magnetic flux density within the ACI through the inserts having magnetic permeability (p) greater than that of air (i.e., approximately $1.25 \times 10^{-6}$ henries per meter) or the conventional dielectric material that would otherwise be within the central region of each coil. In many examples, the result of such improved magnetic flux density may be improved efficiency and/or performance of the ACI. The magnetic flux density (B) is a function of the magnetic field (H) and the permeability of the medium (p) within the coil: (B=μH).

As noted earlier herein, an insert material having a permeability (or relative permeability) twice that of air or dielectric may be used in many examples. However, as can be seen from the above relation of permeability to magnetic flux density, a higher permeability for inserts may be beneficial in some ACI constructions. For example, ferrite materials may have a permeability within the range of approximately $2.0 \times 10^{-5}$ to $8 \times 10^{-4}$ henries per meter, representing a relative permeability of approximately 16-640. As a result, use of inserts including ferrite materials, or other iron composite materials having a similar permeability (e.g., iron oxides, silicon iron, iron ammonium alum, nickel iron alloy or cobalt iron alloy), increases the magnetic flux density of the ACI. In some examples, in which the inserts are a solid block of material, the insert may be formed entirely of a high permeability material (for purposes of the present description, a relative permeability in excess of approximately 2 will be considered "high permeability"). Example materials which may be beneficial include ceramic compounds including a ferrite material. Examples of such ceramic ferrite materials include barium ferrite, strontium ferrite, manganese-zinc ferrite, and nickel-zinc ferrite. In other examples, the inserts may be formed of a matrix containing ferrite nanoparticles. A useful feature of the ceramic ferrite materials, such as those identified, is that the materials are dielectrics, and thus can be placed within the first or second central regions of an ACI in contact with the conductive structure of the coils. In addition to the permeability of the inserts, both the size and placement of the permeability-enhancing inserts can impact the magnetic flux density in the ACI. In some examples, use of multiple inserts, as depicted at 134A-D, may be beneficial.

In other examples, the inserts may be passive electrical circuit components, for example resistors or capacitors, having a high permeability material. In some examples, the high permeability material may be in the form of a sheath or coating around some portion of the circuit component. Such sheath surrounding, or a coating on, the component. The high permeability material can be, for example, any of the above discussed materials. In examples wherein the high permeability material is a coating applied to the electrical component, it can be deposited by any appropriate means, for example, by sputtering onto the circuit component. Such high permeability sheath or coating may be of different thicknesses depending upon the application. In many examples, a thickness of from 1 μm to 50 μm may be used; and in some examples thicknesses of between 5 μm and 30 μm may be used. In some examples, one or more of these circuit components in the inserts can be a component of the voltage regulator circuit. Such components being placed within the dimension of one of the ACI coils reduces space required outside the ACI for such components, further improving space efficiency within the microelectronic device.

As noted earlier herein, in some examples, in which the inserts are a solid material, they may be formed in place within a central region of an ACI coil, such as by sputtering, or another deposition technique. In some such examples, the central region may contain a dielectric, and a trench may be formed in the dielectric to receive the deposited insert material. In examples in which the inserts are preformed (including inserts which are circuit components within a coating or sheath) the inserts may be retained within and ACI central region, for example within trenches in the dielectric, such as by compression bonding or another retention mechanism, such as a reflow process, after placement of the insert(s) in the central region.

Figure 2A:
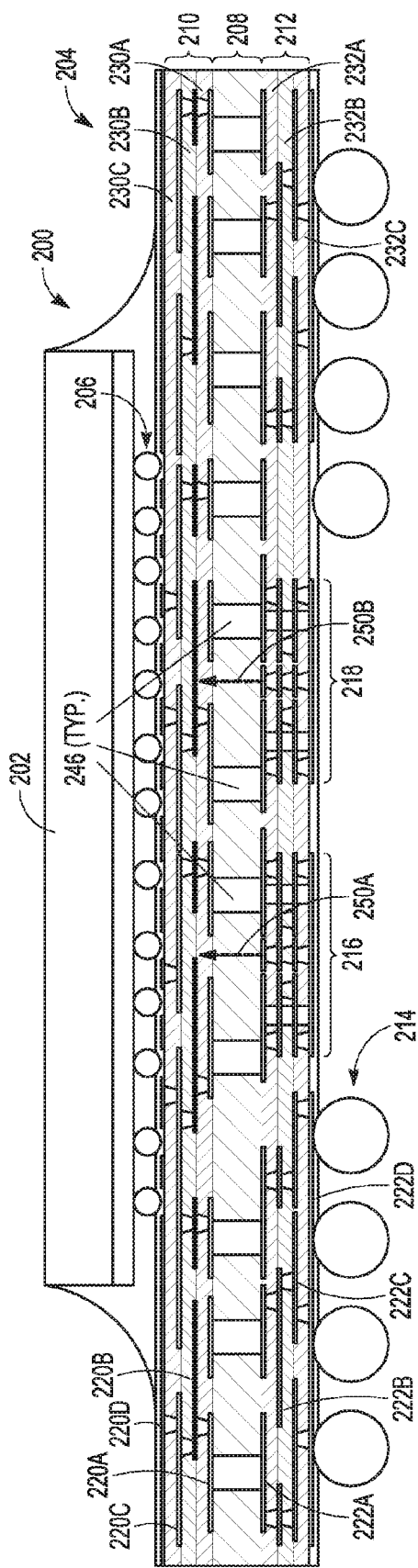
Figure 2B:
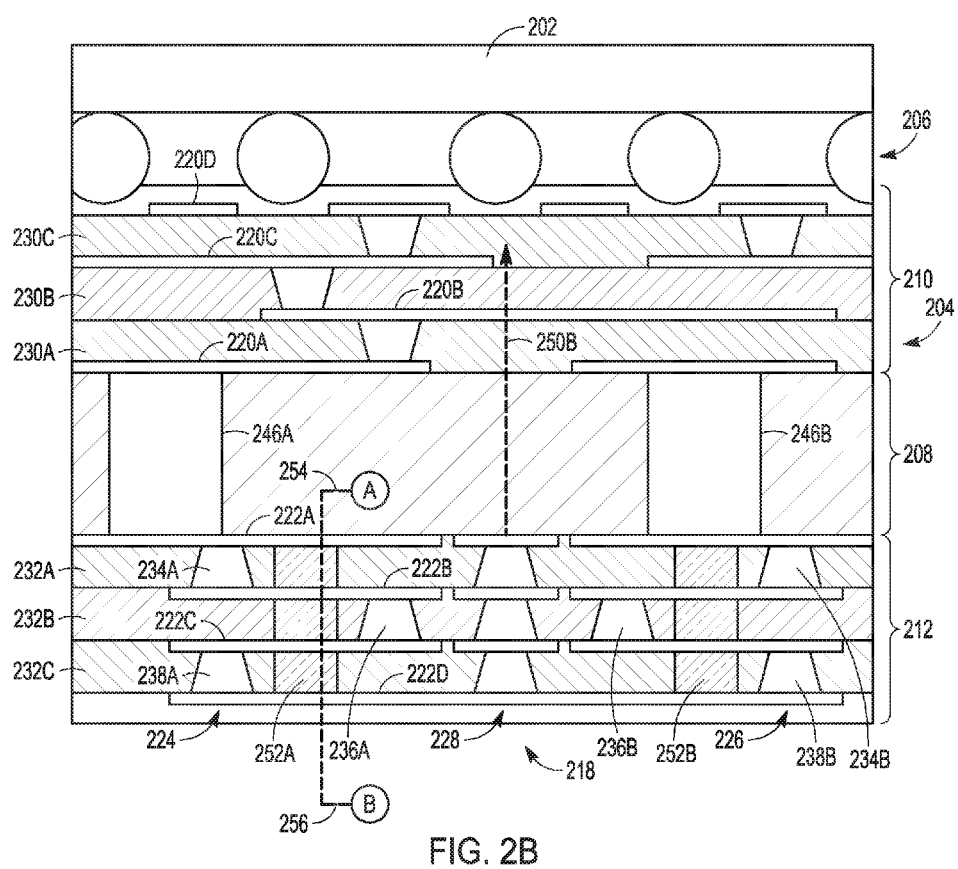

Referring now to FIGS. 2A-B, the figures depict schematic representations of cross-sections of an example microelectronic device 200 incorporating ACI structures generally as discussed herein, in which FIG. 2B depicts an example ACI of microelectronic device 200 in greater detail. Microelectronic device 200 includes a semiconductor die 202 coupled to a substrate, indicated generally at 204. Semiconductor die 202 is coupled to substrate 204 through a solder bump array, indicated generally at 206, with the solder bumps coupled to respective contacts on substrate 204. In the depicted example, substrate 204 is of one example construction, which includes a central core 208 with multilayer redistribution structures 210, 212 on each side of central core 208. Each redistribution structure 210, 212 includes multiple patterned conductive layers vertically interconnected with one another (such as through interconnects formed in micro-vias) to define conductive traces extending between semiconductor die 202 and a device BGA (indicated generally at 214), or other structures in substrate 204. Conductive traces in redistribution structures 210, 212, electrically couple with one another through vertical interconnects, such as plated through hole (PTH) vias (indicated typically at 246), extending through central core 208.

In the depicted example, two ACIs 216, 218 are each formed as an integral part of lower redistribution structure 212 of substrate 204. Other configurations, such as including only a single ACI, or more than two ACIs are contemplated. In the depicted example, the conductive structures of each ACI 216, 218 are formed from the same conductive layers (in many examples, metal layers, such as copper) forming the conductive traces and vertical interconnects in lower redistribution structure 212. In the depicted example, each of redistribution structures 210, 212 includes four metallization layers, indicated at 220A-D and 222A-D, respectively, separated by interleaved dielectric material layers 230A-C and 232A-C, respectively. A different number of metallization layers may be utilized, consistent with providing a sufficient number of metallization layers to form the desired layers of each multilayer coil, as described below. These same four metallization layers (222A-D) of lower redistribution structure 212 form respective layers of each multilayer coil of each ACI 216, 218, which are separated by the same layers of dielectric material (232A-C) as the remainder of the metallization layers 222A-D. The ACI structure will be discussed further specifically in reference to ACI 218, depicted in greater detail in FIG. 2B.

ACI 218 includes two multilayer coils, indicated at 224 and 226. In the depicted example, coils 224 and 226 have similar structures, and thus the corresponding structures of each coil are identified with the same numerals, with the structures of coil 224 having an "A" suffix, and the structures of coil 226 having a "B" suffix. In the depicted example, each coil includes four layers, each formed in a respective metallization layer (222A-D). In the depicted example, each layer defines a substantial portion of a rectangle (as depicted in FIG. 1C), and is serially connected to the next vertically adjacent layer by a respective vertical interconnect 234A-B, 236A-B, 238A-B to form the respective multilayer coil 224, 226. Again, each vertical interconnect within the structure of ACI 218 can be formed as a micro-via. In the depicted example structure, a first end of each multilayer coil 224, 226 extends to, and is electrically coupled to, shorting bar 228 extending between the coils. Shorting bar 228 is again formed from metallization of each layer interconnected by vertical interconnects. Shorting bar 228 may be coupled through one or more, vertical interconnects (such as PTH vias 246 extending through central core 208 and/or conductive traces in redistribution structure 210 to a desired node (as schematically indicated at 250). For example, shorting bar 228 may be electrically coupled to a selected power supply node of die 202. A second end of each multilayer coil 224, 226 may extend to a respective conductive structure, for example PTH vias 246A-B, and through conductive traces to desired nodes. In one example, the second end of each multilayer coil may be electrically coupled to a power supply input node, such as a Vcc node.

Each multilayer coil 224 and 226 extends around a respective central region containing at least one respective insert 252A-B, respectively. In the depicted example, a single insert is depicted in the cross-section of each coil 224, 226. Each insert can be any of the types previously described herein with respect to FIGS. 1A-C. In examples in which one or more of inserts 252A-B is a circuit component, substrate 204 can be configured to provide electrical connections between the insert and other structures, as indicated schematically at 254 and 256 (extending to selected circuit nodes identified as A and B, respectively, relative to insert 252A). Such electrical connections 254, 256 can be formed outside the plane of the cross-section. In some examples, electrical connections 254, 256 can be formed of the same metallization layers forming the layers of each coil 224, 226.

Figure 3:
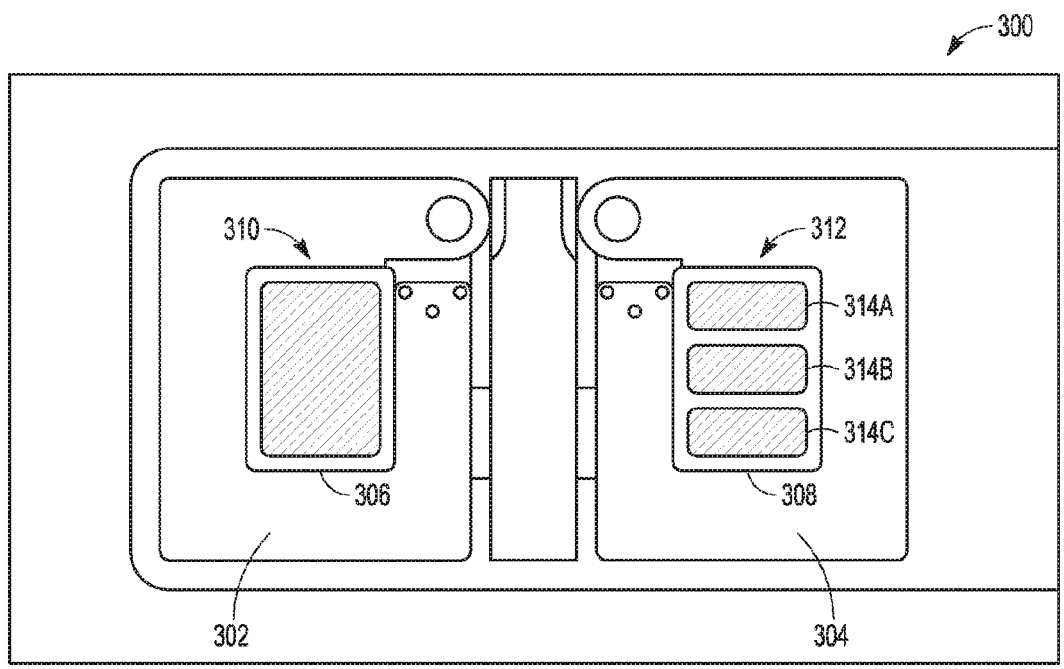
FIG. 3 is a schematic representation of a bottom view of an air core inductor depicting two example configurations for inserts in the inductor, in accordance with the present description.
Figure 4:
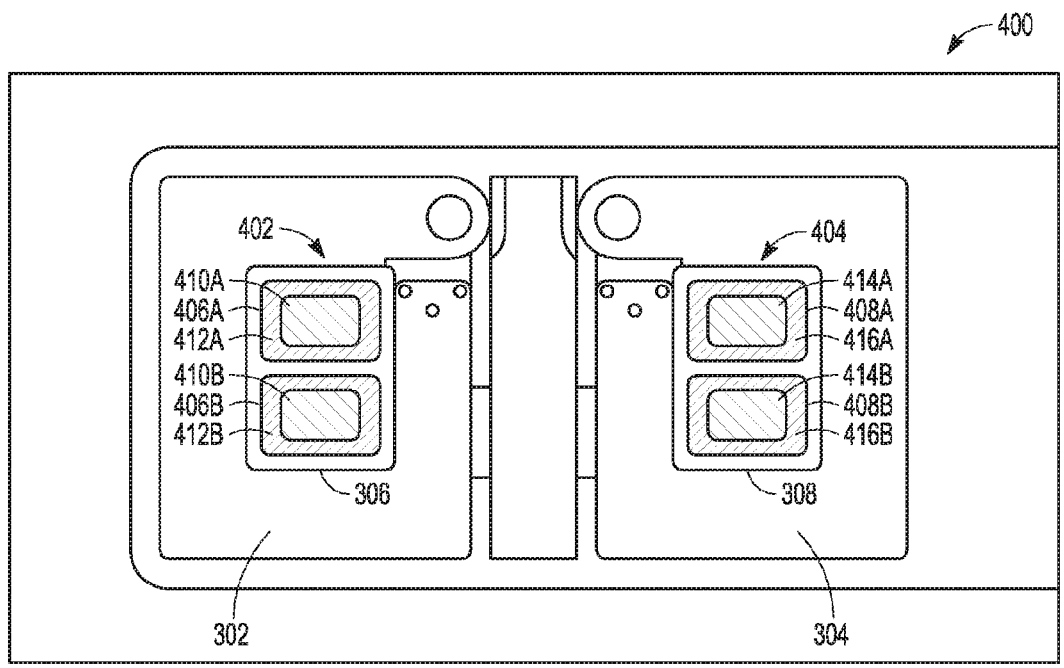
FIG. 4 is a schematic representation of an air core inductor depicting an alternative example configuration for inserts in the inductor, in accordance with the present description.

Referring now to FIGS. 3-4, the figures depict schematic representations of example alternative configurations of inserts with an example ACIs. Example ACI 300 schematically depicts two coils 302, 304 extending around a respective central region 306, 308. Two example configurations for inserts are depicted at 310, 312. In coil 302, a single insert 310 is inserted into central region 306. In the depicted example, insert 310 substantially occupies the area of central region 306. As discussed earlier herein, in many examples, central region 306 may include a dielectric material from the forming of coils 302, 304 (and in some examples as discussed relative to FIGS. 2A-B also forming at least some portion of the remainder of the substrate structures surrounding ACI 300). In such cases, a trench may be formed in the dielectric within central region 306 to receive insert 310. In contrast, in coil 304 three inserts 314A-C are placed in central region 308. Inserts 314A-C can each be placed in a respective trench, or may be arranged in a single trench.

ACI 400 includes the same coil structure as ACI 300, and corresponding structures have been numbered identically in FIG. 4. As previously discussed, inserts within the ACI coils do not have to be solid masses of material, and may be other structures, for example passive electrical circuit components, such as resistors or capacitors, within a sheath or coating having an increased permeability (relative to that of the spacer dielectric within each central region), such as any of the materials identified earlier in reference to FIGS. 1A-C. Thus, in this example, each insert 406A-B in central region 402 includes an electrical component 410A-B surrounded by an increased permeability coating 412A-B, respectively. Electrical components 410A-B do not necessarily need to be the same type of component, and also may be differently sized from one another. Similarly, ACI 400 includes inserts 408A-B in central region 404, each of which includes components 414A-B within a high permeability sheath or coating 416A-B. As noted earlier herein in one example one or more of components 410A-B may be a capacitor, such as a multilayer ceramic chip capacitor or a polymer capacitor with body length (i.e. z-axis in FIG. 4) ranging from 80 μm to 300 μm and terminal width (i.e. x-axis in FIG. 4) ranging from 80 μm to 200 μm. The thickness of the capacitor (i.e. y-axis in FIG. 4) may range from 50 μm to 200 μm. As previously discussed (relative to FIG. 2B), the electrical components 410A-B and 414A-B can be coupled to circuit nodes (A and B, connected to electrical connections 254, 256, respectively), as may be desired, either through the same interconnects and/or metallization layers used for forming each coil 302, 304, or through additional conductive structures.

Figure 5:
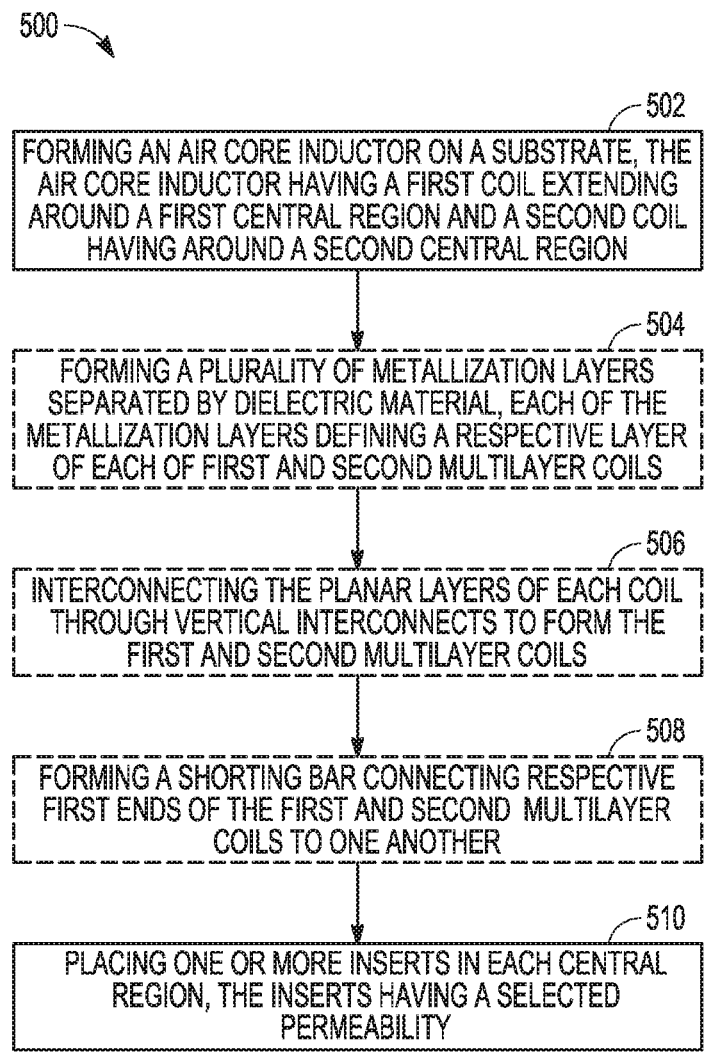
FIG. 5 is a flow chart depicting an example process for forming an air core inductor having example structures as described herein.

Referring now to FIG. 5, the figure depicts a flowchart of an example process 500 for making a microelectronic device as described herein. As indicated at 502, an ACI may be formed on a substrate of the microelectronic device, and may define a first coil extending around a first central region and a second coil extending around a second central region.

In some examples, the forming of the ACI may be accomplished as indicated at 504-508 (depicted with dashed borders to reflect the optional nature of the examples). In the identified example, as indicated at 504, the ACI may be formed of a plurality of planar metallization layers separated by dielectric material, with each of the metallization layers defining a respective layer of each of the first and second multilayer coils.

As indicated at 506, in this optional example, the planar layers of each multilayer coil may be interconnected through vertical interconnects such as micro-vias, connecting ends of vertically adjacent metallization layers in series to form the first and second multilayer coils. Additionally, as indicated at 508, a shorting bar may be formed connecting respective first ends of each of the first and second multilayer coils to one another.

As indicated at 510, in this example, one or more inserts may then be placed within the first and second central regions of the respective coils, with the inserts having a selected permeability. As noted elsewhere herein, in many examples the selected relative permeability may be greater than 2; in particular examples may benefit from inserts having a relative permeability of at least 8, and in some cases of 16 or greater. Again as noted elsewhere herein, the inserts may be either the same or different from one another, and may be either a solid material or an electrical component within a sheath or coating. Any of the previously identified materials herein may be utilized in the example process.

Figure 6A:
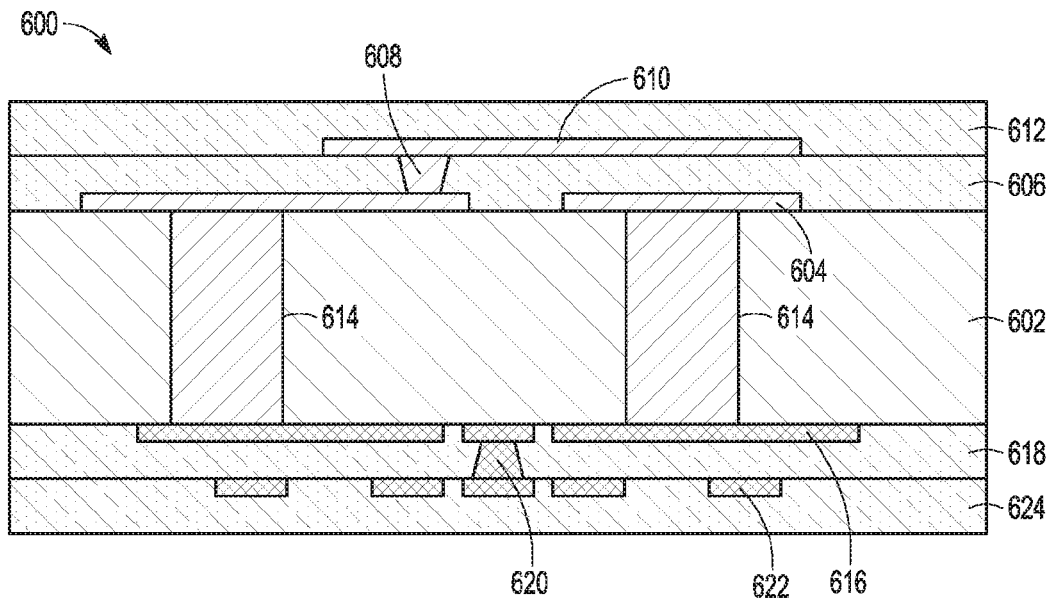
FIGS. 6A-C are schematic representations of representative stages in an example method for performing the example process of FIG. 5.
Figure 6B:
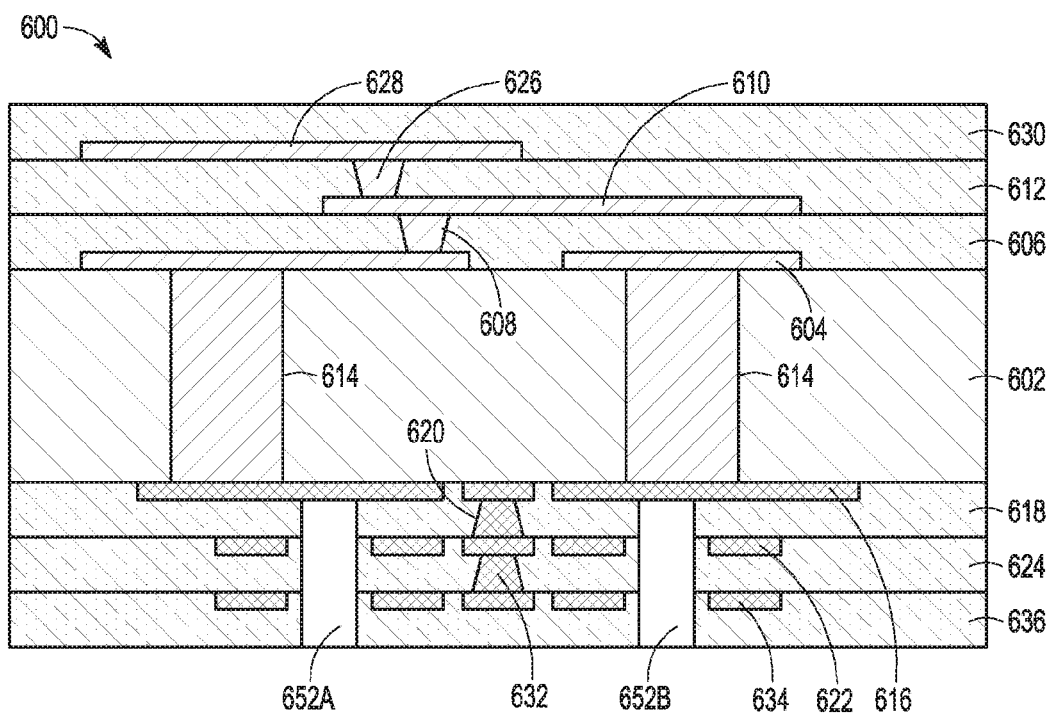
Figure 6C:
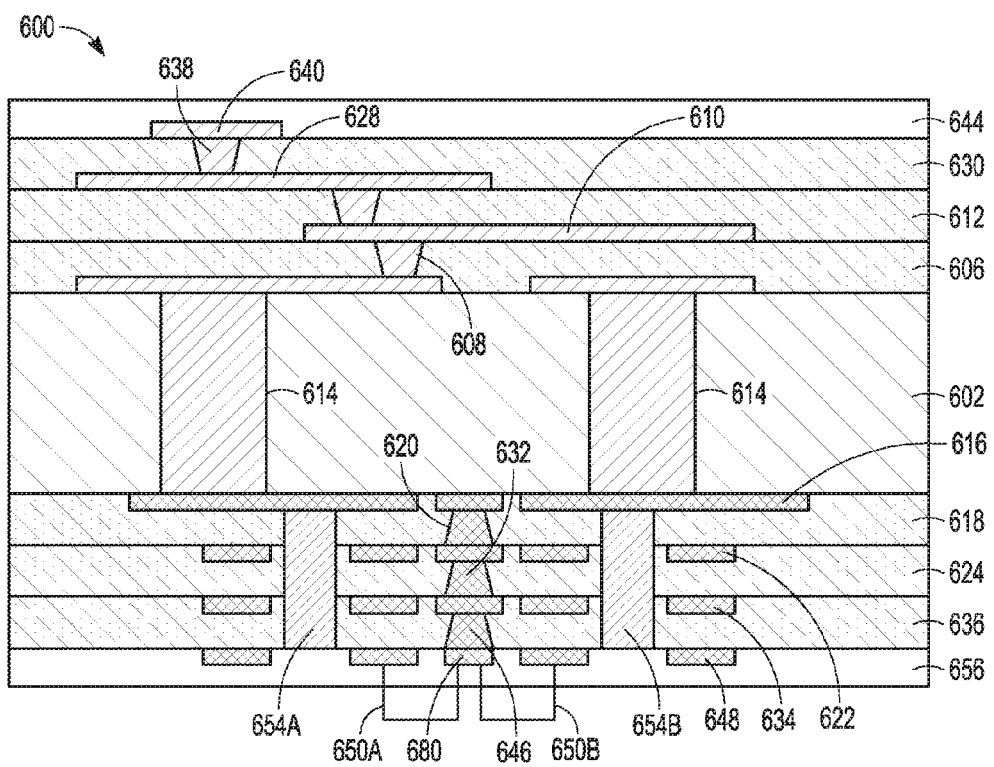

In many examples, the forming of the planar layers of each coil, and also of layers within the shorting bar, may be formed alternately with forming of vertical interconnects to the next layer of the respective structure. Representative stages in forming such an example are depicted in FIGS. 6A-C. FIG. 6A depicts a representative portion of an example substrate, indicated generally at 600, defining a first portion of an ACI. Substrate 600 includes a core 602 having a first patterned upper metallization layer 604 formed thereon and covered with a first upper dielectric layer 606, and also having a first patterned lower metallization layer 616 covered by a first lower dielectric layer 618. In some examples, the first patterned upper and lower metallization layers 604, 616, respectively, may each be formed by laminating a metal foil onto opposite surfaces of core 602. In some examples, PTH vias 614 extending through core 602 may be formed after the described lamination of the metal foils, but before patterning of each of the upper and lower metallization layers 604, 616. Upper and lower metallization layers 604, 616 can be patterned through use of dry film photoresist lamination, development and etching techniques, as known in the art. In the present example, first lower metallization layer 616 defines a first layer (and segment) of each coil.

Substrate 600 includes a first plurality of vertical interconnects (indicated by example at 608) contacting respective portions of first patterned upper metallization layer 604, and a second patterned upper metallization layer 610. In a similar manner, example substrate 600 also includes a plurality of vertical interconnects (indicated by example at 620) connecting structures in first patterned lower metallization layer 616 and a second patterned lower metallization layer 622.

First patterned lower metallization layer 616 defines an upper (in the view as depicted) planar layer of each multilayer coil (in the depicted example, each coil ultimately having four planar layers). Second patterned lower metallization layer 622 may form a second segment of each multilayer coil. Though only a single vertical interconnect 620 is depicted in the cross-section, additional vertical interconnects may be placed outside the plane of the cross-section, to connect the coil layers defined in the first and second patterned lower metallization layers 616, 622.

The second patterned upper metallization layer 610 is covered with a second upper dielectric layer 612. Similarly, a first lower dielectric layer 618 extends between first and second patterned lower metallization layers 616, 622. Second patterned lower metallization layer 622 is then covered with a second lower dielectric layer 624.

FIG. 6B depicts the substrate of FIG. 6A after forming of another plurality of vertical interconnects (indicated by example at 626) and third patterned upper metallization layer 628, and overlying dielectric layer 630. Additionally, in FIG. 6B another plurality of vertical interconnects are formed, as indicated at 632, which connect with locations of a third patterned lower metallization layer 634, which is then covered by dielectric layer 636. In the depicted example, at least one trench 652A-B is formed within the respective central region of each coil.

As shown in FIG. 6C, a group of vertical interconnects 638 is then formed through dielectric layer 630 followed by a fourth patterned upper metallization layer 640. In the depicted example, layer of solder resist 644 is then formed over fourth upper metallization layer 640. On the lower side of substrate 600, after forming of another layer of vertical interconnects 646, a fourth patterned lower metallization layer 648 is formed in connection with vertical interconnects 646, completing the structure of each coil. In many examples, a first end of the lower (as depicted) planar layer of each coil may be electrically connected (as indicated at 650A, 650B) to the structure of shorting bar 680. At least one insert 654A-B, as described herein, is then placed within each trench 652A-B.

Figure 6D:
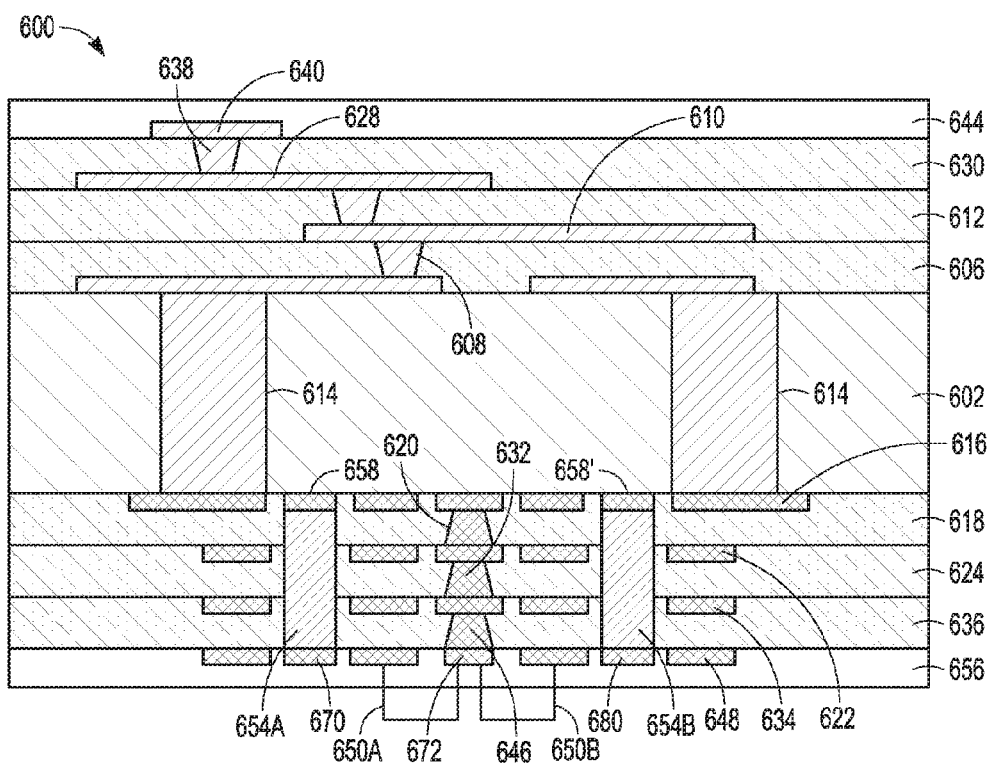
FIGS. 6D-E are schematic representations of optional alternative structures that may be formed in the example method.
Figure 6E:
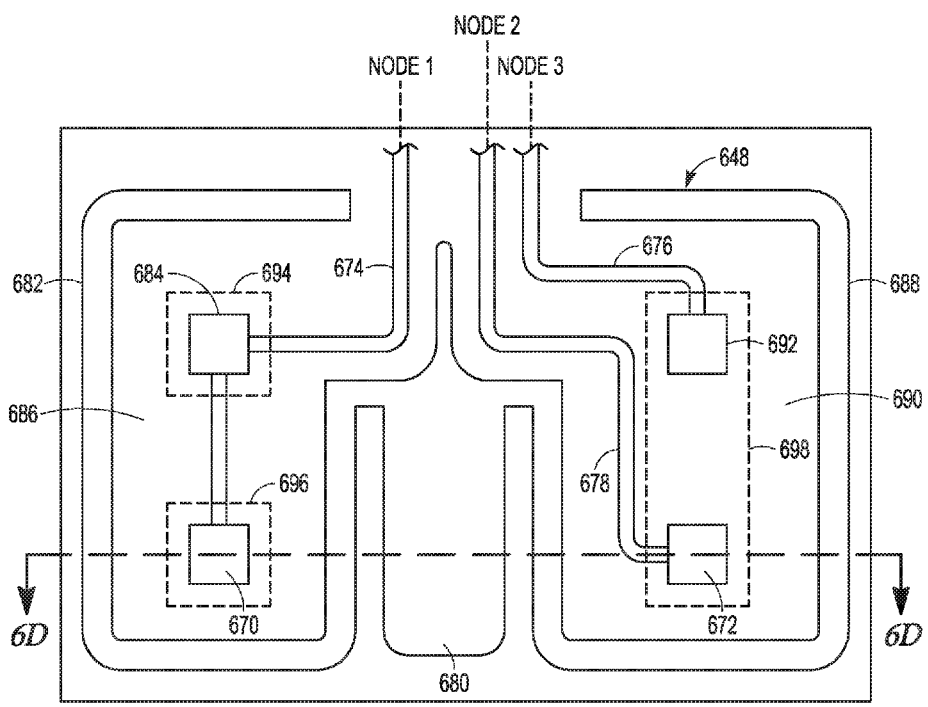

FIGS. 6D-E are schematic representations of alternative structures in accordance with the foregoing example. In example systems, in which one or more of the inserts includes a passive electrical component, electrical interconnections may be made with the electrical component. These electrical interconnections may be made by any of a variety of structures. These figures depict one example, in which the metallization layer 616 used for the uppermost layer of each coil also forms an electrical contact 658, 658' to one or more of inserts 654A, 654B. Similarly, the metallization layer 648 forming the lowermost layer of each coil also forms an electrical contact 670, 672 with inserts 654A, 654B, respectively.

FIG. 6E is a schematic representation of an example conductor routing that could be implemented in a lower metallization layer (such as layer 648) depicting two alternative structures for providing electrical connections with one or more inserts which are circuit components. Within a central region 686 in a first coil layer 682, contact 670 is coupled to an optional additional contact 684 and to a conductive trace 674 extending to a desired circuit node ("node 1"). This structure can facilitate an electrical connection with two electrical components, schematically indicated in phantom at 694 and 696, each extending above a respective contact 670, 684, and with one or both extending to a contact (as indicated at 658 in FIG. 6D), depending upon whether the components are to be coupled in series or in parallel.

An alternative configuration is depicted in central region 690 within a second coil layer 688, in which two contacts 672 and 692 are coupled respectively to traces 678 and 676, which each extends to a respective circuit node ("node 2" and "node 3"). In this example, a single electronic component, schematically indicated in phantom at 698, may be coupled to electrically extend between contacts 672 and 692, and therefore between the corresponding circuit nodes to which they extend. Each of coil layers 682, 688 may also be coupled to shorting bar 680, as discussed earlier herein.

Many types of microelectronic device which include an inductor can benefit from use of one or more ACIs incorporating one or more flux-enhancing inserts as described herein. One example would be a microelectronic device including a processor or another type of device having an associated voltage regulator. The microelectronic device incorporating one or more ACIs with insert(s) may then be included in a larger electronic device or system, as described below.

Figure 7:
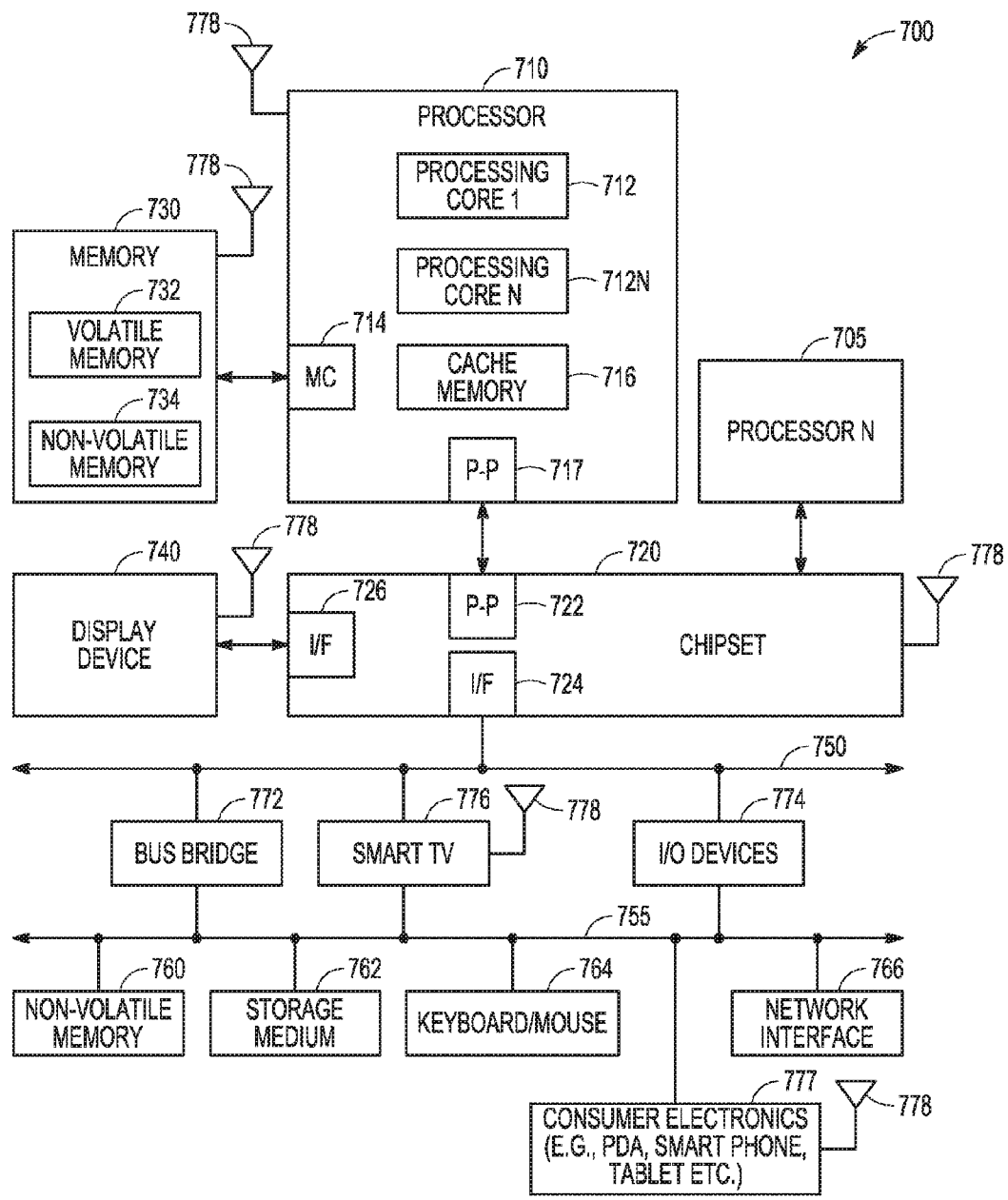
FIG. 7 is block diagram of an electronic system in accordance with some embodiments of the invention.

FIG. 7 illustrates a system level diagram, according to one embodiment of the invention. For instance, FIG. 7 depicts an example of an electronic device (e.g., system) including a microelectronic device including an ACI incorporating one or more magnetic flux-enhancing inserts as described herein. FIG. 7 is included to show an example of a higher level device application for the present invention. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In one embodiment, processor 710 has one or more processing cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the invention, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices 772, 776, 774, 760, 762, 764, 766, 777, etc. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the invention, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In one embodiment, chipset 720 couples with a non-volatile memory 760, a mass storage device(s) 762, a keyboard/mouse 764, a network interface 766, a smart TV 776, consumer electronic(s) 777, etc. via interface 724.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

To better illustrate the methods and apparatuses described herein, a non-limiting set of example embodiments are set forth below as numerically identified examples:

Example 1 is a microelectronic device, optionally including a substrate; an air core inductor supported by the substrate, the air core inductor includes a first coil extending around a first central region and a second coil extending around a second central region; and at least one insert in at least one of the first and second central regions, the insert having a relative permeability of 2 or greater.

In Example 2, the subject matter of Example 1 optionally includes a semiconductor die coupled to a first side of the substrate.

In Example 3, the subject matter of any one or more of Examples 1-2 where each of the first and second coils is a multilayer coil.

In Example 4, the subject matter of Example 3 optionally includes a dielectric material extending between each coil of the first and second multilayer coils.

In Example 5, the subject matter of any one or more of Examples 1-4 where each of the first and second central regions optionally includes at least one insert having a relative permeability of 2 or greater.

In Example 6, the subject matter of any one or more of Examples 4-5 where the air core inductor further optionally includes a shorting bar extending between the first and second multilayer coils.

In Example 7, the subject matter of any one or more of Examples 4-6 where the dielectric material extends into at least one of the first and second central regions, and where the insert is placed within a trench in the dielectric material in the at least one of the first and second central regions.

In Example 8, the subject matter of any one or more of Examples 1-7 where the at least one insert optionally includes a plurality of inserts within at least one of the first and second central regions.

In Example 9, the subject matter of any one or more of Examples 1-8 where the substrate optionally includes a recess housing the air core inductor.

In Example 10, the subject matter of Example 9 where the recess containing the air core inductor is proximate a surface of the substrate opposite the first surface coupled to the semiconductor die.

In Example 11, the subject matter of Example 10 where each of the first and second multilayer coils has a respective first end coupled to a power supply.

In Example 12, the subject matter of Example 11 where each of the first and second multilayer coils has a respective second end coupled to the shorting bar.

In Example 13, the subject matter of Example 12 where the shorting bar is electrically coupled to a power supply node of the semiconductor die.

In Example 14, the subject matter of any one or more of Examples 1-13 where at least one insert is a solid material having a permeability of at least $1.0\times10^{-5}$ henries per meter.

In Example 15, the subject matter of Example 14 where the at least one insert includes at least one of a ferrite material and an iron composite material.

In Example 16, the subject matter of Example 15 where the at least one insert includes a ferrite material optionally including at least one of barium ferrite, strontium ferrite, a manganese-zinc ferrite, and a nickel-zinc ferrite.

In Example 17, the subject matter of any one or more of Examples 1-16 where the solid material optionally includes ferrite nanoparticles.

In Example 18, the subject matter of Example 17 where the ferrite nanoparticles optionally include particles of at least one of barium ferrite, strontium ferrite, manganese-zinc ferrite, and nickel-zinc ferrite.

In Example 19, the subject matter of any one or more of Examples 1-18 where at least one insert optionally includes an electrical component.

In Example 20, the subject matter of Example 19 where the electrical component optionally includes a passive electrical component that is coated with at least one of a ferrite material and an iron composite material.

In Example 21, the subject matter of Example 20 where the passive electrical component optionally includes a capacitor.

In Example 22, the subject matter of any one or more of Examples 19-21 where the passive electrical component is electrically coupled between selected nodes of an electrical circuit.

Example 23 is a microelectronic device, optionally including: a substrate; a semiconductor die coupled to a first surface of the substrate; and an air core inductor formed in the substrate, the air core inductor including, a first multilayer coil extending around a first central region and having a first end and a second end, a second multilayer coil extending around a second central region and having a first end and a second end, and a shorting bar extending between the first and second multilayer coils, the shorting bar coupled to the first ends of each of the first and second multilayer coils, and at least one first insert in the first central region and at least one second insert in the second central region, each insert including at least one of a ferrite material and an iron composite material.

In Example 24, the subject matter of Example 23 where each multilayer coil optionally includes a plurality of planar metal layers separated by dielectric material, the planar metal layers sequentially connected with vertical interconnects.

In Example 25, the subject matter of any one or more of Examples 23-24 where dielectric material extends into the first and second central regions, and where the first and second inserts are placed within respective trenches formed in the dielectric material in the first and second central regions.

In Example 26, the subject matter of any one or more of Examples 23-25 where at least one insert optionally includes a solid material having a relative permeability of at least 16.

In Example 27, the subject matter of any one or more of Examples 23-26 where at least one insert optionally includes a solid material having a relative permeability of at least 16 to 640.

In Example 28, the subject matter of any one or more of Examples 23-27 where at least one insert optionally includes at least one of a ferrite material and an iron composite material.

In Example 29, the subject matter of any one or more of Examples 23-28 where at least one insert optionally includes a ferrite material including at least one of barium ferrite, strontium ferrite, a manganese-zinc ferrite, and a nickel-zinc ferrite.

In Example 30, the subject matter of any one or more of Examples 28-29 where the solid material optionally includes ferrite nanoparticles.

In Example 31, the subject matter of Example 30 where the ferrite nanoparticles include particles of at least one of barium ferrite, strontium ferrite, manganese-zinc ferrite, and nickel-zinc ferrite.

In Example 32, the subject matter of any one or more of Examples 23-31 where at least one insert optionally includes a passive electrical component having a permeability of at least $1.0 \times 10^{-5}$ henries per meter.

In Example 33, the subject matter of Example 32 where the passive electrical component optionally is coated at least one of a ferrite material and an iron composite material.

In Example 34, the subject matter of Example 33 where the passive electrical component optionally includes a capacitor.

In Example 35, the subject matter of any one or more of Examples 32-34 where the substrate defines at least one electrical connection with the passive electrical component.

In Example 36, the subject matter of Example 35 where the electrical connection with the passive electrical component is formed at least in part through one or more of the metallization layers forming the first and second multilayer coils.

In Example 37, the subject matter of any one or more of Examples 35-36 where the at least one electrical connection with the passive electrical component optionally includes two electrical connections, and where each electrical connection is formed at least in part through one or more of the metallization layers forming the first and second multilayer coils.

In Example 38, the subject matter of Example 37 where the two electrical connections with the passive electrical component are each formed at least in part through the same metallization layer.

In Example 39, the subject matter of any one or more of Examples 23-38 where at least one of the first and second central regions optionally includes multiple inserts therein.

Example 40 is a method of making a microelectronic device, optionally including: forming an air core inductor on a substrate, the air core inductor defining a first coil extending around a first central region and a second coil extending around a second central region; and placing an insert in each of the first and second central regions, the inserts having a relative permeability of 2 or greater.

In Example 41, the subject matter of Example 40 where the first and second coils are each a multilayer coil having a respective first end and a second end.

In Example 42, the subject matter of Example 41 where the forming of an air core inductor on the substrate optionally includes: forming a plurality of planar metallization layers separated by dielectric material, where each of the planar metallization layers defines a respective layer of each of the first and second multilayer coils, where the planar layers of each coil are successively coupled through vertical interconnects to form the first and second multilayer coils.

In Example 43, the subject matter of Example 42 where the forming of an air core inductor on the substrate further optionally includes: forming a shorting bar connecting the respective first ends of the first and second multilayer coils to one another.

In Example 44, the subject matter of Example 43 optionally includes forming an electrical connection between the shorting bar and a first contact on a die-receiving surface of the substrate.

In Example 45, the subject matter of any one or more of Examples 40-44 optionally including coupling a semiconductor die to the die-receiving surface of the substrate with the first contact on the die receiving surface of the substrate coupled to a power supply input node on the semiconductor die.

In Example 46, the subject matter of Example 45 where the air core inductor is optionally formed as an integral structure of the substrate.

In Example 47, the subject matter of any one or more of Examples 45-46 where the air core inductor is optionally formed in an inductor recess in a side of the substrate opposite the die-receiving surface.

In Example 48, the subject matter of any one or more of Examples 40-47 where at least one insert is optionally formed through sputtering of a high permeability material.

In Example 49, the subject matter of Example 48 optionally includes placing at least one of the first and second inserts by sputtering a high permeability material into at least one of the first and second central regions.

In Example 50, the subject matter of any one or more of Examples 48-49 where the at least one insert is formed by sputtering a high permeability coating onto a passive electrical component.

In Example 51, the subject matter of any one or more of Examples 40-50 where at least one insert is optionally a solid material having a permeability of at least $1.0 \times 10^{-5}$ henries per meter.

In Example 52, the subject matter of any one or more of Examples 40-51 where at least one insert is optionally a solid material having a relative permeability of at least 16.

In Example 53, the subject matter of Example 52 where the at least one insert optionally includes at least one of a ferrite material and an iron composite material.

In Example 54, the subject matter of Example 53 where the at least one insert optionally includes a ferrite material including at least one of barium ferrite, strontium ferrite, a manganese-zinc ferrite, and a nickel-zinc ferrite.

In Example 55, the subject matter of any one or more of Examples 53-54 where the solid material optionally includes ferrite nanoparticles.

In Example 56, the subject matter of Example 55 where the ferrite nanoparticles optionally include particles of at least one of barium ferrite, strontium ferrite, manganese-zinc ferrite, and nickel-zinc ferrite.

In Example 57, the subject matter of any one or more of Examples 40-56 optionally including at least one insert that includes an electrical component.

In Example 58, the subject matter of Example 57 where the electrical component is a passive electrical component that is coated with at least one of a ferrite material and an iron composite material.

In Example 59, the subject matter of Example 58 where the passive electrical component includes a capacitor.

In Example 60, the subject matter of any one or more of Examples 58-59 optionally including forming at least one electrical connection in the substrate with the passive electrical component.

In Example 61, the subject matter of Example 60 where the electrical connection with the passive electrical component is formed at least in part through one or more of the metallization layers forming the first and second multilayer coils.

In Example 62, the subject matter of Example 61 where the at least one electrical connection with the passive electrical component optionally includes two electrical connections, and where each electrical connection is formed at least in part through one or more of the metallization layers forming the first and second multilayer coils.

In Example 63, the subject matter of Example 62 where the two electrical connections with the passive electrical component are each formed at least in part through the same metallization layer.

Example 64 is an electronic system, including: a microelectronic device, optionally including, a semiconductor die; a substrate coupled to the semiconductor die, the substrate including, an air core inductor supported by the substrate, the air core inductor including a first coil extending around a first central region and a second coil extending around a second central region; and at least one insert in at least one of the first and second central regions, the insert having a relative permeability of at least 2; and at least one of a mass storage device and a network interface operably coupled to the microelectronic device.

In Example 65, the subject matter of Example 64 where the first and second coils are each a multilayer coil having a respective first end and a second end; and where there is at least one insert in each of the first and second central regions.

In Example 66, the subject matter of Example 65 where the inserts are retained within one or more trenches in each of the first and second central regions.

In Example 67, the subject matter of Example 66 where each insert is retained within a respective trench in one of the first and second central regions.

In Example 68, the subject matter of any one or more of Examples 65-67 where the air core inductor further optionally includes: a shorting bar extending between the first and second multilayer coils, the shorting bar coupled to the first ends of each of the first and second multilayer coils, and also coupled through the substrate to a power supply node of the semiconductor die.

In Example 69, the subject matter of any one or more of Examples 64-68 where at least one insert is a solid material having a permeability of at least $1.0\times10^{-5}$ henries per meter.

In Example 70, the subject matter of any one or more of Examples 64-69 where at least one insert is a solid material having a relative permeability of at least 16.

In Example 71, the subject matter of any one or more of Examples 69-70 where the at least one insert optionally includes at least one of a ferrite material and an iron composite material.

In Example 72, the subject matter of Example 71 where the at least one insert optionally includes a ferrite material including at least one of barium ferrite, strontium ferrite, a manganese-zinc ferrite, and a nickel-zinc ferrite.

In Example 73, the subject matter of Example 72 where the solid material optionally includes ferrite nanoparticles.

In Example 74, the subject matter of Example 73 where the ferrite nanoparticles optionally include particles of at least one of barium ferrite, strontium ferrite, manganese-zinc ferrite, and nickel-zinc ferrite.

In Example 75, the subject matter of any one or more of Examples 64-74 where at least one insert optionally includes an electrical component.

In Example 76, the subject matter of Example 75 where the electrical component is a passive electrical component that is coated with at least one of a ferrite material and an iron composite material.

In Example 77, the subject matter of any one or more of Examples 64-76 where the passive electrical component optionally includes a capacitor.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A microelectronic device, comprising
a substrate;
an air core inductor supported by the substrate, the air core inductor includes a first coil extending around a first central region and a second coil extending around a second central region; and
at least one insert in at least one of the first and second central regions, the insert having a relative permeability of 2 or greater;
wherein dielectric material extends into at least one of the first and second central regions, and wherein the at least one insert is placed within a trench in the dielectric material in the at least one of the first and second central regions.

2. The microelectronic device of claim 1, further comprising a semiconductor die coupled to a first side of the substrate.

3. The microelectronic device of claim 1, wherein each of the first and second central regions includes at least one insert having a relative permeability of 2 or greater.

4. A microelectronic device, comprising
a substrate;
an air core inductor supported by the substrate, the air core inductor includes a first coil extending around a first central region and a second coil extending around a second central region; and
at least one insert in at least one of the first and second central regions, the insert having a relative permeability of 2 or greater;
wherein the air core inductor further comprises a shorting bar extending between the first and second multilayer coils.

5. The microelectronic device of claim 1, wherein the at least one insert comprises a plurality of inserts within the dielectric material in at least one of the first and second central regions.

6. The microelectronic device of claim 1, wherein at least one insert is a solid material having a permeability of at least $1.0 \times 10^{-5}$ henries per meter.

7. The microelectronic device of claim 6, wherein the at least one insert comprises at least one of a ferrite material and an iron composite material.

8. A microelectronic device, comprising
a substrate;
an air core inductor supported by the substrate, the air core inductor includes a first coil extending around a first central region and a second coil extending around a second central region; and
at least one insert in at least one of the first and second central regions, the insert having a relative permeability of 2 or greater;
wherein the at least one insert comprises a dielectric ceramic ferrite material including at least one of barium ferrite, strontium ferrite, a manganese-zinc ferrite, and a nickel-zinc ferrite.

9. The microelectronic device of claim 6, wherein the solid material comprises ferrite nanoparticles.

10. A microelectronic device, comprising:
a substrate;
an air core inductor supported by the substrate, the air core inductor includes a first coil extending around a first central region and a second coil extending around a second central region; and
at least one insert in at least one of the first and second central regions, the insert having a relative permeability of 2 or greater;
wherein at least one insert comprises an electrical component.

11. The microelectronic device of claim 10, wherein the electrical component is a passive electrical component that is coated with at least one of a ferrite material and an iron composite material.

12. A method of making a microelectronic device, comprising:
forming an air core inductor on a substrate, the air core inductor defining a first coil extending around a first central region and a second coil extending around a second central region, wherein dielectric material extends into each of the first and second central regions; and
placing an insert in respective recesses in the dielectric material in each of the first and second central regions, the inserts having a relative permeability of 2 or greater.

13. The method of claim 12, wherein the forming of an air core inductor on the substrate comprises forming a plurality of planar metallization layers separated by dielectric material, wherein each of the planar metallization layers defines a respective layer of each of the first and second multilayer coils, and wherein the planar layers of each coil are successively coupled through vertical interconnects to form the first and second multilayer coils.

14. The method of claim 12, further comprising coupling a semiconductor die to the die-receiving surface of the substrate with a first contact on the die receiving surface of the substrate coupled to a power supply input node on the semiconductor die, wherein the first contact is electrically coupled to a node of the air core inductor.

15. The method of claim 12, wherein the air core inductor is formed as an integral structure of the substrate.

16. The method of claim 12, wherein placing at least one of the first and second inserts comprises sputtering a high permeability material into at least one of the first and second central regions.

17. The method of claim 12, wherein at least one insert is a solid material having a permeability of at least $1.0 \times 10^{-5}$ henries per meter.

18. The method of claim 17, wherein the at least one insert comprises at least one of a ferrite material and an iron composite material.

19. A method of making a microelectronic device, comprising:
- forming an air core inductor on a substrate, the air core inductor defining a first coil extending around a first central region and a second coil extending around a second central region; and
- placing an insert in each of the first and second central regions, the inserts having a relative permeability of 2 or greater;
- wherein the at least one insert comprises a dielectric ceramic ferrite material including at least one of barium ferrite, strontium ferrite, a manganese-zinc ferrite, and a nickel-zinc ferrite.

20. The method of claim 12, wherein at least one insert comprises an electrical component.

21. An electronic system, comprising:
- a microelectronic device, comprising,
- a semiconductor die;
- a substrate coupled to the semiconductor die, the substrate including,
  - an air core inductor supported by the substrate, the air core inductor including a first coil extending around a first central region and a second coil extending around a second central region wherein dielectric material extends into at least one of the first and second central regions; and
  - at least one insert in at least one of the first and second central regions, the insert having a relative permeability of 2 or greater, wherein the at least one insert is placed within a recess in the dielectric material in the at least one of the first and second central regions; and
- at least one of a mass storage device and a network interface operably coupled to the microelectronic device.

22. The electronic system of claim 21, wherein at least one insert is a solid material having a permeability of at least $1.0 \times 10^{-5}$ henries per meter.

23. The electronic system of claim 21, wherein the at least one insert comprises a ferrite material including at least one of barium ferrite, strontium ferrite, a manganese-zinc ferrite, and a nickel-zinc ferrite.

* * * * *